(12) United States Patent
Wan et al.

(10) Patent No.: US 12,406,857 B2
(45) Date of Patent: Sep. 2, 2025

(54) METHOD FOR FABRICATING ARRAY STRUCTURE OF COLUMNAR CAPACITOR AND SEMICONDUCTOR STRUCTURE

(71) Applicant: CHANGXIN MEMORY TECHNOLOGIES, INC., Hefei (CN)

(72) Inventors: Qiang Wan, Hefei (CN); Kangshu Zhan, Hefei (CN); Jun Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 423 days.

(21) Appl. No.: 18/151,469

(22) Filed: Jan. 9, 2023

(65) Prior Publication Data

US 2023/0298899 A1    Sep. 21, 2023

Related U.S. Application Data

(63) Continuation of application No. PCT/CN2022/072659, filed on Jan. 19, 2022.

(30) Foreign Application Priority Data

Aug. 24, 2021   (CN) .......................... 202110973338.5

(51) Int. Cl.
*H01L 21/311* (2006.01)
*H10D 1/68* (2025.01)

(52) U.S. Cl.
CPC ......... *H01L 21/31144* (2013.01); *H10D 1/68* (2025.01)

(58) Field of Classification Search
CPC ... H10D 1/68; H01G 4/38; H01G 4/33; H01L 21/31144; H10B 12/50
See application file for complete search history.

(56) References Cited

U.S. PATENT DOCUMENTS

| | | | |
|---|---|---|---|
| 2017/0077102 A1 | 3/2017 | Kim et al. | |
| 2018/0166449 A1* | 6/2018 | Pak ...................... | H10B 12/033 |

(Continued)

FOREIGN PATENT DOCUMENTS

| | | |
|---|---|---|
| CN | 103681676 A | 3/2014 |
| CN | 110010604 A | 7/2019 |

(Continued)

*Primary Examiner* — Changhyun Yi
(74) *Attorney, Agent, or Firm* — Kilpatrick Townsend & Stockton LLP

(57) ABSTRACT

Embodiments provide a method for fabricating an array structure of a columnar capacitor and a semiconductor structure. In the method, before a mask layer is removed, a photoresist layer is filled to adjust a thickness of the mask layer in a peripheral region and a thickness of the mask layer in an array region to be equal, thereby preventing a top support layer from being worn due to impacts of different thicknesses of the mask layers on a thickness of the top support layer. In addition, in the method, a third sacrificial layer and an auxiliary layer are further formed to perform dual protection on the top support layer, thereby preventing the top support layer from being thinned in subsequent processes, to increase support strength of the top support layer, thereby further preventing the columnar capacitor from tilting due to insufficient support strength of the top support layer.

13 Claims, 9 Drawing Sheets

(56) References Cited

U.S. PATENT DOCUMENTS

2019/0198506 A1* 6/2019 Kim .................... H10B 12/485
2021/0151439 A1  5/2021 Choi et al.
2023/0015120 A1* 1/2023 Wan ........................ H10D 1/68

FOREIGN PATENT DOCUMENTS

| CN | 110504284 A | 11/2019 |
| CN | 111725139 A | 9/2020 |
| CN | 111771279 A | 10/2020 |
| KR | 20120050327 A | 5/2012 |

* cited by examiner

US 12,406,857 B2

METHOD FOR FABRICATING ARRAY STRUCTURE OF COLUMNAR CAPACITOR AND SEMICONDUCTOR STRUCTURE

CROSS-REFERENCE TO RELATED APPLICATION

The present disclosure is a continuation of PCT/CN2022/072659, filed on Jan. 19, 2022, which claims priority to Chinese Patent Application No. 202110973338.5 titled "METHOD FOR FABRICATING ARRAY STRUCTURE OF COLUMNAR CAPACITOR AND SEMICONDUCTOR STRUCTURE" and filed on Aug. 24, 2021, the entire contents of which are incorporated herein by reference.

TECHNICAL FIELD

The present disclosure relates to the field of semiconductor technology, and more particularly, to a method for fabricating an array structure of a columnar capacitor and a semiconductor structure.

BACKGROUND

As a semiconductor memory device commonly used in computers, dynamic random access memory (DRAM) includes many repeated memory cells. In a process of fabricating the DRAM below 20 nm, the DRAM uses a stacked capacitor structure in most cases, and a capacitor of the DRAM is a vertical columnar capacitor with a high depth-to-width ratio.

Because the columnar capacitor has a high depth-to-width ratio, to increase stability of the columnar capacitor, it is generally necessary to provide a support layer to support the columnar capacitor. A defect in an existing method for fabricating a columnar capacitor is as follows. A top support layer is easily worn. Consequently, support strength of the top support layer is insufficient, and thus the columnar capacitor may be caused to tilt or even peel, which adversely affects performance of the columnar capacitor.

Therefore, it is necessary to provide a method for fabricating an array structure of a columnar capacitor, to resolve a problem in the prior art that a top support layer is easy to be worn, and the like.

SUMMARY

Embodiments of the present disclosure provide a method for fabricating an array structure of a columnar capacitor and a semiconductor structure.

According to some embodiments of the present disclosure, one aspect of the present disclosure provides a method for fabricating an array structure of a columnar capacitor, including:

providing a substrate provided with a plurality of conductive pads therein, where a first sacrificial layer, an intermediate support layer, a second sacrificial layer, a top support layer and a mask layer are stacked on the substrate, the substrate is divided into an array region and a peripheral region, a thickness of the mask layer positioned in the array region is less than a thickness of the mask layer positioned in the peripheral region, and a plurality of capacitor holes in the array region penetrate through the mask layer, the top support layer, the second sacrificial layer, the intermediate support layer and the first sacrificial layer, to expose the plurality of conductive pads; forming a photoresist layer, where the photoresist layer is filled in the plurality of capacitor holes and covers the mask layer in the array region; removing a part of the mask layer in the peripheral region, where an upper surface of a remaining part of the mask layer in the peripheral region is flush with an upper surface of the mask layer in the array region; removing the photoresist layer on a surface of the mask layer and etching the mask layer by using the top support layer as an etching stop layer; forming a third sacrificial layer, where the third sacrificial layer covers the top support layer; removing the photoresist layer; filling a conductive material in the plurality of capacitor holes to form a lower electrode, where the lower electrode is electrically connected to the plurality of conductive pads; forming an auxiliary layer, where the auxiliary layer covers the third sacrificial layer and the lower electrode; patterning the auxiliary layer, the third sacrificial layer and the top support layer, and removing the third sacrificial layer and the second sacrificial layer; patterning the intermediate support layer and removing the first sacrificial layer and the auxiliary layer; forming a dielectric layer, where the dielectric layer covers an exposed surface of the substrate, an exposed surface of the lower electrode, an exposed surface of the intermediate support layer, and an exposed surface of the top support layer; and forming an upper electrode, where the upper electrode covers a surface of the dielectric layer. The step of forming the photoresist layer further includes: forming a photoresist material layer, where the photoresist material layer is filled in the plurality of capacitor holes and covers the mask layer in the array region and the mask layer in the peripheral region; and etching back the photoresist material layer until the mask layer in the peripheral region is exposed, to form the photoresist layer.

According to some embodiments of the present disclosure, another aspect of the present disclosure further provides a semiconductor structure, which includes: a substrate, where a plurality of conductive pads are arranged in the substrate, and the substrate is divided into an array region and a peripheral region; a first sacrificial layer, an intermediate support layer, a second sacrificial layer, a top support layer and a third sacrificial layer stacked on the substrate, where a surface of the top support layer positioned in the array region is flush with a surface of the top support layer positioned in the peripheral region; a lower electrode arranged in the array region, where the lower electrode penetrates through the third sacrificial layer, the top support layer, the second sacrificial layer, the intermediate support layer and the first sacrificial layer, and is electrically connected to the plurality of conductive pads; and an auxiliary layer, where the auxiliary layer covers the third sacrificial layer and the lower electrode.

BRIEF DESCRIPTION OF THE DRAWINGS

To describe the technical solutions of the embodiments of the present disclosure more clearly, the accompanying drawings required for describing the embodiments of the present disclosure will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

To make the objectives, technical means and effects of the present disclosure clearer, the present disclosure will be further described below with reference to the accompanying drawings. It should be understood that the embodiments described herein are some but not all of the embodiments of the present disclosure, and are not intended to limit the present disclosure. All other embodiments obtained by a person of ordinary skill in the art based on the embodiments of the present disclosure without creative efforts shall fall within the protection scope of the present disclosure.

FIGS. 1A to 1D are schematic cross-sectional views of a semiconductor structure corresponding to a main process for forming a lower electrode of an array structure of a columnar capacitor according to a first embodiment of the present disclosure.

Figure 1A:
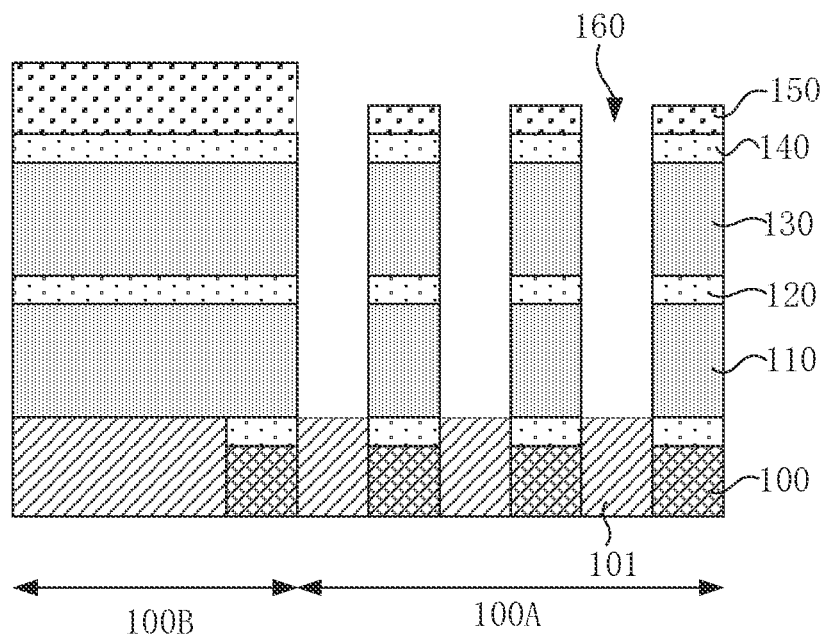
FIG. 1A is a cross-sectional schematic diagram of forming capacitor holes provided by the first embodiment of the present invention.

Referring to FIG. 1A, a substrate 100 is provided. A plurality of conductive pads 101 are arranged in the substrate 100. A first sacrificial layer 110, an intermediate support layer 120, a second sacrificial layer 130, a top support layer 140 and a mask layer 150 are stacked on the substrate 100. The substrate 100 is divided into an array region 100A and a peripheral region 100B, and a thickness of the mask layer 150 positioned in the array region 100A is less than that of the mask layer 150 positioned in the peripheral region 100B. In the array region 100A, a plurality of capacitor holes 160 penetrate through the mask layer 150, the top support layer 140, the second sacrificial layer 130, the intermediate support layer 120 and the first sacrificial layer 110, to expose the conductive pads 101.

Figure 1B:
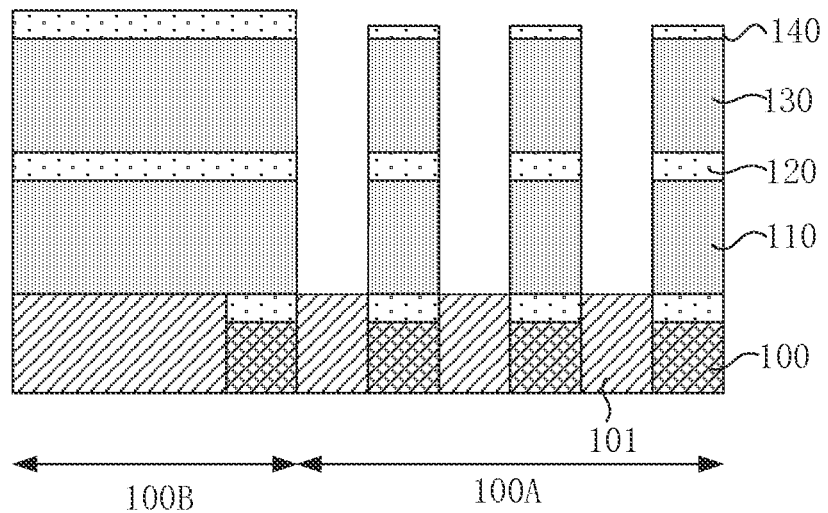
FIG. 1B is a cross-sectional schematic diagram of a mask layer removed provided by the first embodiment of the present invention.

Referring to FIG. 1B, the mask layer 150 is removed. In this step, the thickness of the mask layer 150 in the peripheral region 100B is greater than that of the mask layer 150 in the array region 100A. Therefore, if the mask layer 150 in the peripheral region 100B is entirely removed, the top support layer 140 in the array region 100A is worn, and thus becomes thinner compared with the peripheral region 100B.

Figure 1C:
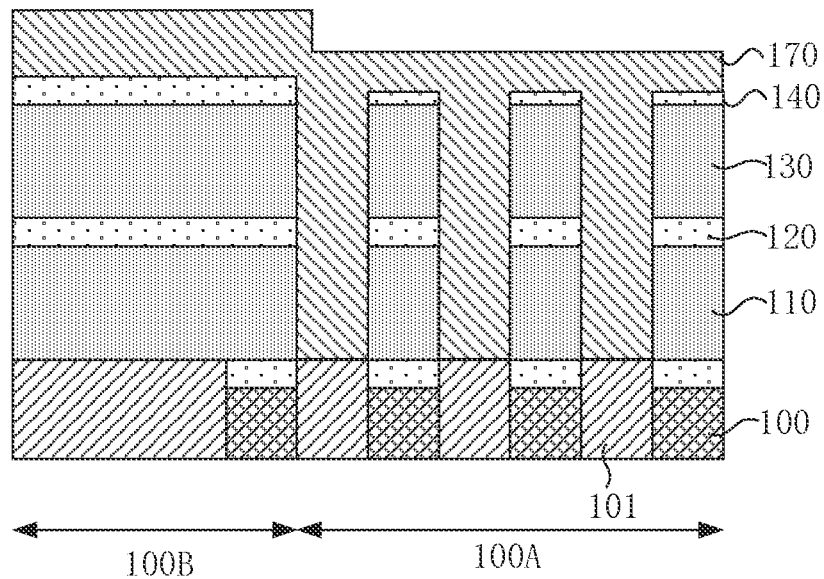
FIG. 1C is a cross-sectional schematic diagram of a conductive material filled provided by the first embodiment of the present invention.

Referring to FIG. 1C, a conductive material 170 is filled. The conductive material 170 is filled in the capacitor hole 160 and covers a surface of the top support layer 140. In this step, a thickness of the conductive material 170 deposited in the peripheral region 100B is greater than that of the conductive material 170 deposited in the array region 100A.

Figure 1D:
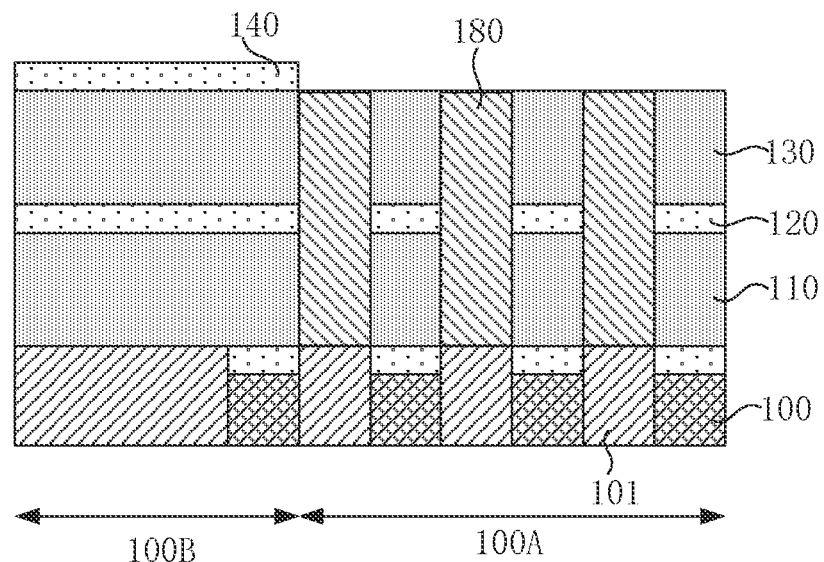
FIG. 1D is a cross-sectional schematic diagram of forming a lower electrode provided by the first embodiment of the present invention.

As shown in FIG. 1D, the conductive material 170 on the surface of the top support layer 140 is removed, and a lower electrode 180 is formed in the capacitor hole 160. In this step, the thickness of the conductive material 170 deposited in the peripheral region 100B is greater than the thickness of the conductive material deposited in the array region 100A. Therefore, if the conductive material in the peripheral region 100B is entirely removed, the thickness of the top support layer 140 in the array region 100A is further reduced, or even the top support layer 140 in the array region 100A is entirely removed. Consequently, the subsequently formed columnar capacitor has insufficient top support strength, and thus is prone to tilt, which adversely affects the performance of the array structure of the columnar capacitor, thus further adversely affecting the performance of a memory, and reducing yield of the memory.

To resolve the foregoing technical problem, a second embodiment of the present disclosure further provides a method for fabricating the array structure of the columnar capacitor, which can prevent the top support layer from being worn, thereby ensuring the thickness and the support strength of the top support layer, preventing the columnar capacitor from tilting, improving the performance of the columnar capacitor, and further increasing the yield of the memory. In some embodiments, in the method for fabricating the array structure of the columnar capacitor in the present disclosure, before the mask layer is removed, the photoresist layer is filled to adjust the thickness of the mask layer in the peripheral region and the thickness of the mask layer in the array region to be equal, thereby preventing the top support layer from being worn due to impacts of different thicknesses of the mask layers on the thickness of the top support layer. In addition, in the method, a third sacrificial layer and an auxiliary layer are further formed to perform dual protection on the top support layer, thereby preventing the top support layer from being thinned in subsequent processes, to increase support strength of the top support layer, thereby further preventing the columnar capacitor from tilting due to insufficient support strength of the top support layer.

Figure 2:
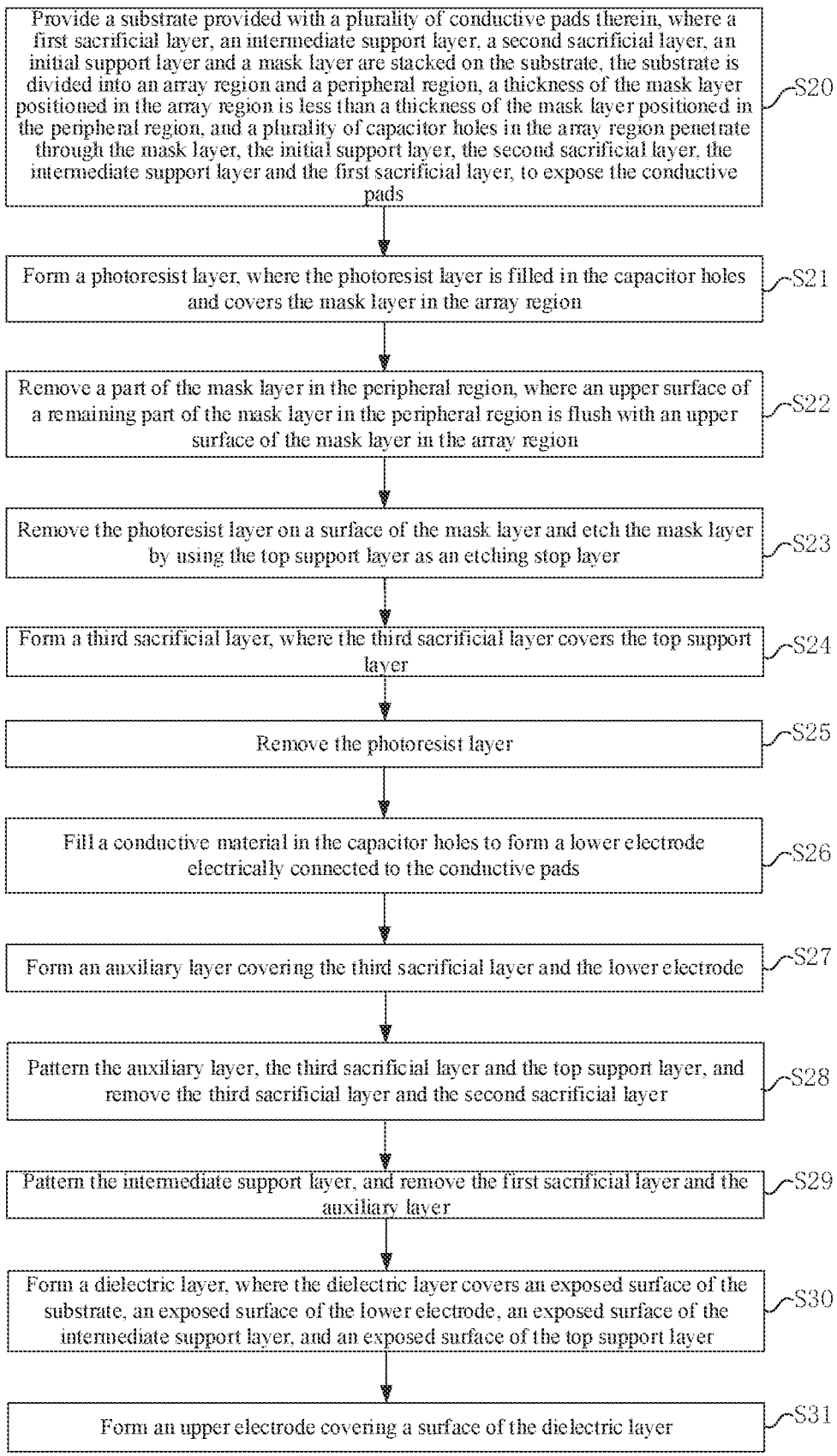
FIG. 2 is a schematic diagram of steps of a method for fabricating an array structure of a columnar capacitor according to a second embodiment of the present disclosure.

FIG. 2 is a schematic diagram of steps of a method for fabricating an array structure of a columnar capacitor according to a second embodiment of the present disclosure. Referring to FIG. 2, the method includes following steps of: Step S20, providing a substrate provided with a plurality of conductive pads therein, where a first sacrificial layer, an intermediate support layer, a second sacrificial layer, a top support layer and a mask layer are stacked on the substrate, the substrate is divided into an array region and a peripheral region, a thickness of the mask layer positioned in the array region is less than a thickness of the mask layer positioned in the peripheral region, and a plurality of capacitor holes in the array region penetrate through the mask layer, the top support layer, the second sacrificial layer, the intermediate support layer and the first sacrificial layer, to expose the plurality of conductive pads; Step S21, forming a photoresist layer, where the photoresist layer is filled in the plurality of capacitor holes and covers the mask layer in the array region; Step S22, removing a part of the mask layer in the peripheral region, where an upper surface of a remaining part of the mask layer in the peripheral region is flush with an upper surface of the mask layer in the array region; Step S23, removing the photoresist layer on a surface of the mask layer and etching the mask layer by using the top support layer as an etching stop layer; Step S24, forming a third sacrificial layer, where the third sacrificial layer covers the top support layer; Step S25, removing the photoresist layer; Step S26, filling a conductive material in the plurality of capacitor holes to form a lower electrode, where the lower electrode is electrically connected to the plurality of conductive pads; Step S27, forming an auxiliary layer, where the auxiliary layer covers the third sacrificial layer and the lower electrode; Step S28, patterning the auxiliary layer, the third sacrificial layer and the top support layer, and removing the third sacrificial layer and the second sacrificial layer; Step S29, patterning the intermediate support layer and removing the first sacrificial layer and the auxiliary layer; Step S30, forming a dielectric layer, where the dielectric layer covers an exposed surface of the substrate, an exposed surface of the lower electrode, an exposed surface of the intermediate support layer, and an exposed surface of the top support layer; and Step S31, forming an upper electrode, where the upper electrode covers a surface of the dielectric layer.

FIGS. 3A to 3L are schematic cross-sectional views of a main semiconductor structure formed by means of the method according to the second embodiment of the present disclosure.

Figure 3A:
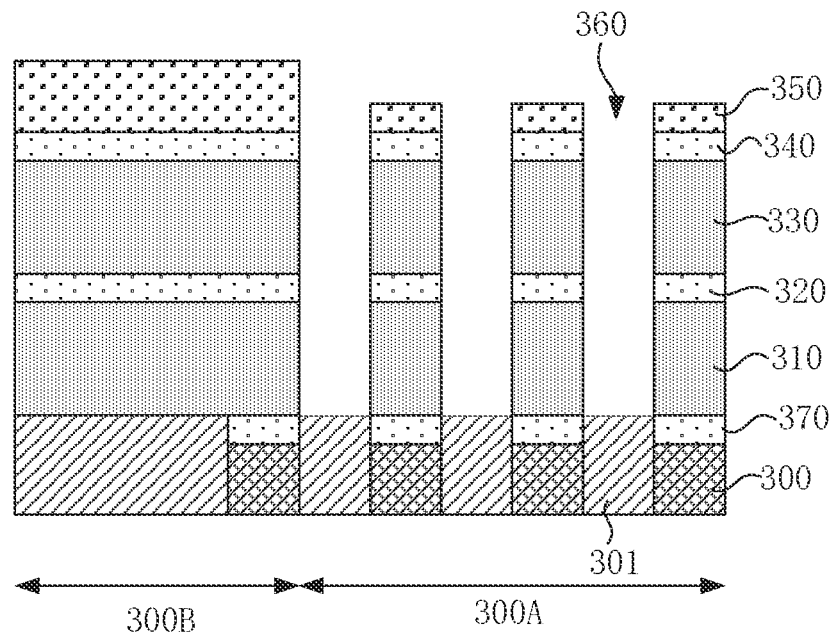
FIG. 3A is a cross-sectional schematic diagram of forming capacitor holes provided by the second embodiment of the present invention.

In Step S20, referring to FIG. 3A, a substrate 300 is provided. A plurality of conductive pads 301 are arranged in the substrate 300. A first sacrificial layer 310, an intermediate support layer 320, a second sacrificial layer 330, a top support layer 340 and a mask layer 350 are stacked on the substrate 300. The substrate 300 is divided into an array region 300A and a peripheral region 300B, and a thickness of the mask layer 350 positioned in the array region 300A is less than that of the mask layer 350 positioned in the peripheral region 300B. In the array region 300A, a plurality of capacitor holes 360 penetrate through the mask layer 350, the top support layer 340, the second sacrificial layer 330, the intermediate support layer 320 and the first sacrificial layer 310, to expose the conductive pads 301.

The substrate 300 may include a silicon substrate, a germanium (Ge) substrate, a silicon germanium (SiGe) substrate, a silicon-on-insulator (SOI) substrate or a germanium-on-insulator (GOI) substrate, etc. The substrate 300 may also be a substrate including other elemental semiconductors or compound semiconductors, such as gallium arsenide, indium phosphide, or silicon carbide, etc., and the substrate 300 may also be a stack structure, such as a silicon/germanium silicon stack, etc. In addition, the substrate 300 may be an ion-doped substrate, which may be P-type doped or N-type doped. In the substrate 300, a plurality of peripheral devices may also be formed, such as field effect transistors, capacitors, inductors and/or P-N junction diodes, etc. In this embodiment, the substrate 300 is the silicon substrate, which further includes other device structures, such as a bit line structure, a transistor structure, etc., which are not shown because they are not related to the present disclosure.

In this embodiment, a material of the first sacrificial layer 310 and a material of the second sacrificial layer 330 may be oxides such as silicon oxide; and a material of the intermediate support layer 320 and a material of the top support layer 340 may be nitrides such as silicon nitride. A material of the mask layer 350 may be polysilicon.

In this embodiment, a bottom support layer 370 is further provided on the substrate 300. The bottom support layer 370 covers the substrate 300 and exposes the conductive pads 301, and the first sacrificial layer 310 covers the bottom support layer 370. A material of the bottom support layer 370 may be nitrides such as silicon nitride.

Figure 3B:
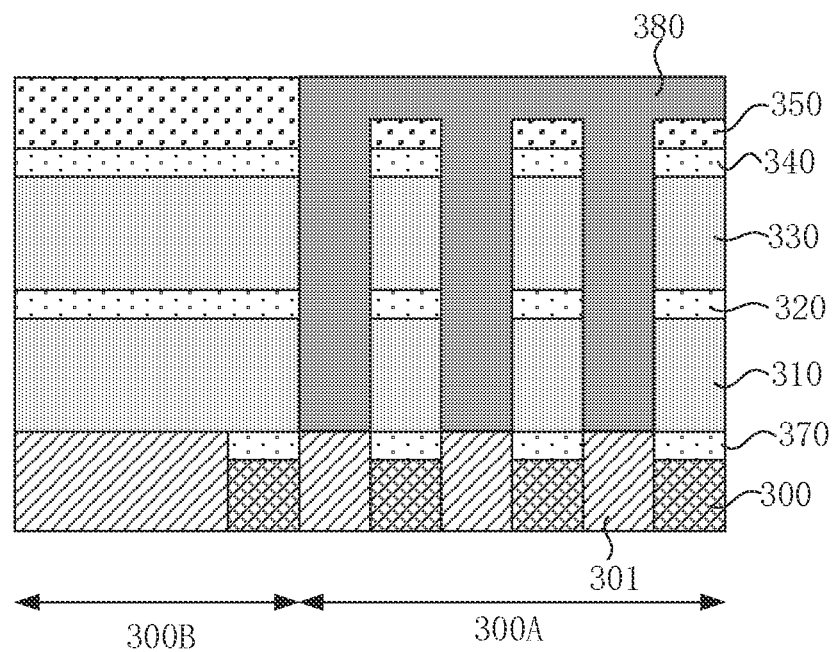
FIG. 3B is a cross-sectional schematic diagram of filling a photoresist layer in the capacitor holes provided by the second embodiment of the present invention.

In Step S21, referring to FIG. 3B, a photoresist layer 380 is formed, where the photoresist layer 380 fills the capacitor hole 360 and covers the mask layer 350 in the array region 300A. In this embodiment, an upper surface of the photoresist layer 380 is flush with an upper surface of the mask layer 350 in the peripheral region 300B.

In this step, the photoresist layer 380 is filled into the capacitor hole 360, and the mask layer 350 in the array region 300A is protected. In some embodiments, a photoresist material layer is first formed, and then the photoresist material layer is etched back, to form the photoresist layer 380. In some embodiments, the photoresist material layer is formed, where the photoresist material layer is filled in the capacitor hole 360 and covers the mask layer 350 in the array region 300A and the mask layer 350 in the peripheral region 300B. Next, the photoresist material layer is etched back, to expose the mask layer 350 in the peripheral region 300B, and the remaining photoresist material layer is used as the photoresist layer 380.

Figure 3C:
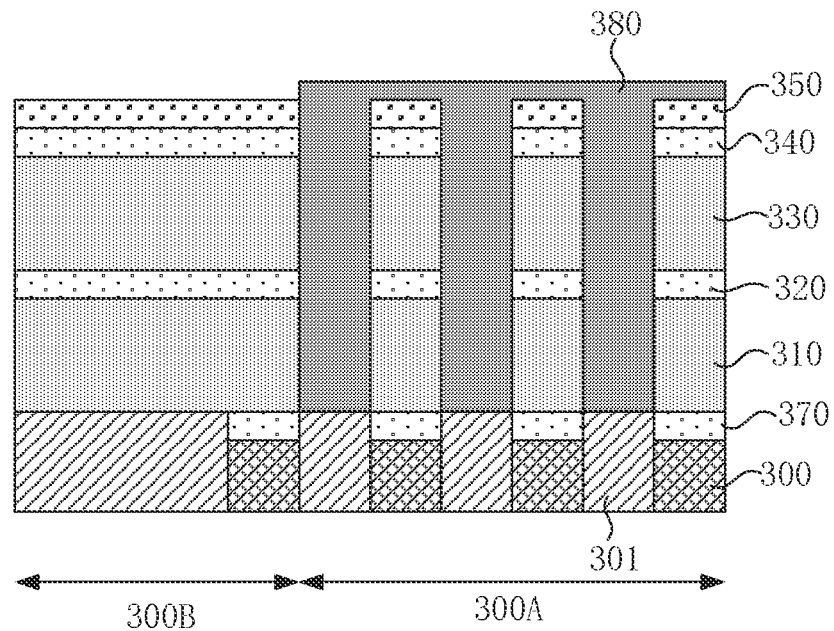
FIG. 3C is a cross-sectional schematic diagram of removing partial mask layer of the peripheral area provided by the second embodiment of the present invention.

In Step S22, referring to FIG. 3C, in the peripheral region 300B, part of the mask layer 350 is removed, such that an upper surface of the remaining mask layer 350 in the peripheral region 300B is flush with that of the mask layer 350 in the array region 300A.

In this step, the photoresist layer 380 is used as a barrier layer of the mask layer 350 in the array region 300A, and the mask layer 350 in the peripheral region 300B is not blocked by the photoresist layer 380. Therefore, the mask layer 350 in the peripheral region 300B may be etched and thinned, such that the upper surface of the remaining mask layer 350 in the peripheral region 300B is flush with the upper surface of the mask layer 350 in the array region 300A. In some embodiments of the present disclosure, due to limitation of an actual process, when the mask layer 350 in the peripheral region 300B is removed, the photoresist layer 380 is also partially removed. That is, the photoresist layer 380 is also thinned.

In this step, an etching rate of an etching substance to the mask layer 350 is greater than an etching rate to the photoresist layer 380, to prevent the photoresist layer 380 from being entirely etched. For example, the mask layer 350 is dry-etched by using at least one of HBr and $NF_3$ as an etching gas, and the etching rate of the etching gas HBr or NF$_3$ to the mask layer 350 is greater than the etching rate of the etching gas HBr or NF$_3$ to the photoresist layer 380.

An objective of this step is to remove a height difference between the mask layer 350 in the peripheral region 300B and the mask layer 350 in the array region 300A. The thickness of the remaining mask layer 350 in the peripheral region 300B is equal to that of the mask layer 350 in the array region 300A, such that when the mask layer 350 is subsequently removed, a case (as shown in FIG. 1B) where the top support layer 340 in the array region 300A is worn to entirely remove the mask layer 350 in the peripheral region 300B does not occur, thereby preventing the thickness of the top support layer 340 in the array region 300A from being smaller than that of the top support layer 340 in the peripheral region 300B.

Figure 3D:
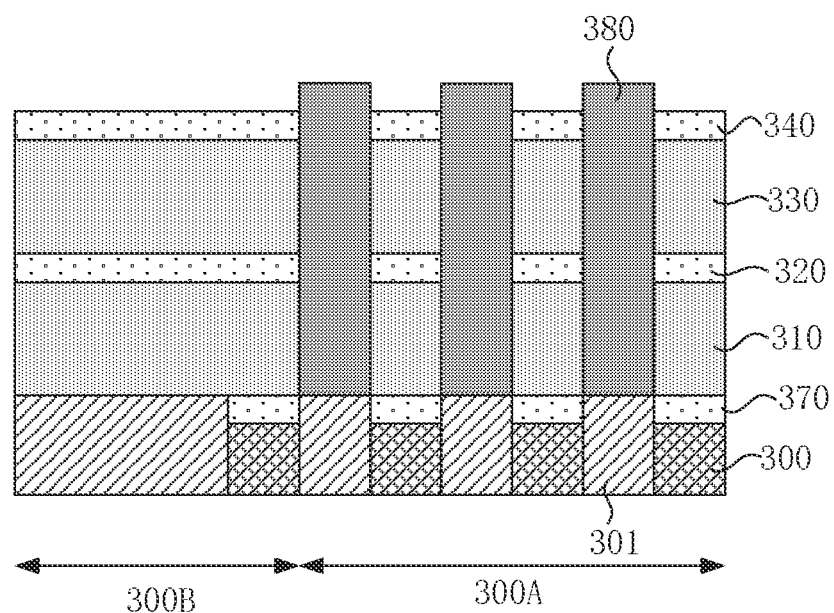
FIG. 3D is a cross-sectional schematic diagram of exposing the top support layer provided by the second embodiment of the present invention.

In Step S23, referring to FIG. 3D, the photoresist layer 380 on the surface of the mask layer 350 is removed, and the mask layer 350 is etched using the top support layer 340 as an etching stop layer.

In this step, the photoresist layer 380 on the surface of the mask layer 350 is removed to expose the mask layer 350, and then the mask layer 350 is etched until the top support layer 340 is exposed.

In this step, the mask layer 350 is removed by means of a dry etching process. The etching rate of the etching substance to the mask layer 350 is greater than the etching rate to the photoresist layer 380 and an etching rate to the top support layer 340, to prevent the photoresist layer 380 and the top support layer 340 from being etched. In this embodiment, the mask layer 350 is a polycrystalline silicon mask layer, and the top support layer 340 is a silicon nitride layer. In this case, the mask layer 350 may be dry-etched by using at least one of HBr and NF$_3$ as the etching gas, to remove the mask layer 350. The etching rate of the etching gas HBr or NF$_3$ to polysilicon is greater than the etching rate of the etching gas HBr or NF$_3$ to silicon nitride.

In this step, because the thickness of the remaining mask layer 350 in the peripheral region 300B is equal to the thickness of the mask layer 350 in the array region 300A, a degree of thinning the top support layer 340 in the peripheral region 300B is equal to a degree of thinning the top support layer 340 in the array region 300A, such that after this step, a thickness of an exposed part of the top support layer 340 in the peripheral region 300B is also equal to a thickness of an exposed part of the top support layer 340 in the array region 300A.

Figure 3E:
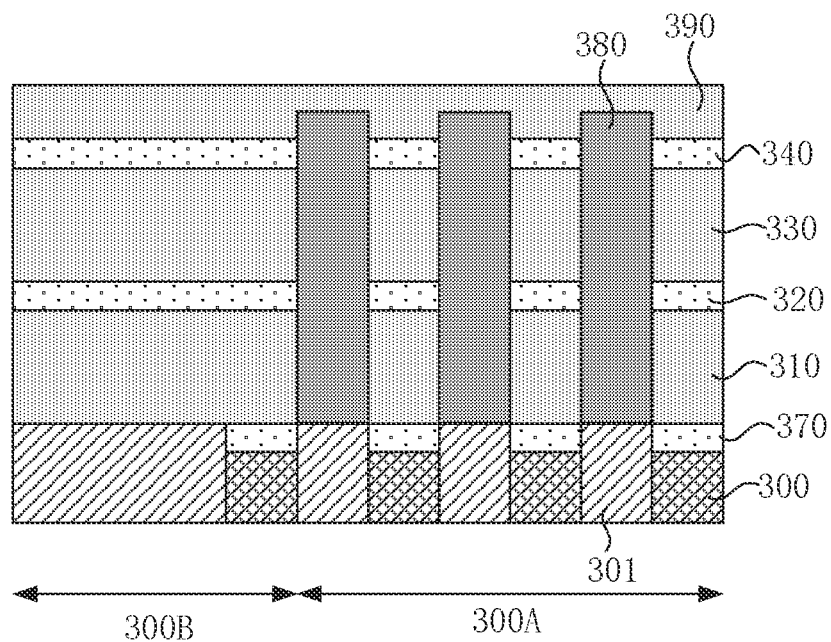
FIG. 3E is a cross-sectional schematic diagram of forming a third sacrificial layer provided by the second embodiment of the present invention.

In Step S24, referring to FIG. 3E, a third sacrificial layer 390 is formed, and the third sacrificial layer 390 covers the top support layer 340.

In this step, the third sacrificial layer 390 is deposited and formed on the surface of the top support layer 340. A deposition method may be an atomic layer deposition process, a chemical vapor deposition process, a spin-on deposition process, or the like. In some embodiments, due to limitation of an actual process, the third sacrificial layer 390 not only covers the surface of the top support layer 340, but also covers the top of the photoresist layer 380. The third sacrificial layer 390 may be an oxide layer, such as a silicon oxide layer, and the third sacrificial layer 390 may be made of the same material as the first sacrificial layer 310 and the second sacrificial layer 330.

In some embodiments, a method of forming the third sacrificial layer 390 includes following steps of: forming a third sacrificial material layer, where the third sacrificial material layer covers the top support layer 340 and the photoresist layer 380; and thinning the third sacrificial material layer until the photoresist layer 380 is exposed, to form the third sacrificial layer 390. A method of forming the third sacrificial material layer may be an atomic layer deposition process, a chemical vapor deposition process, a spin-on deposition process, or the like.

Figure 3F:
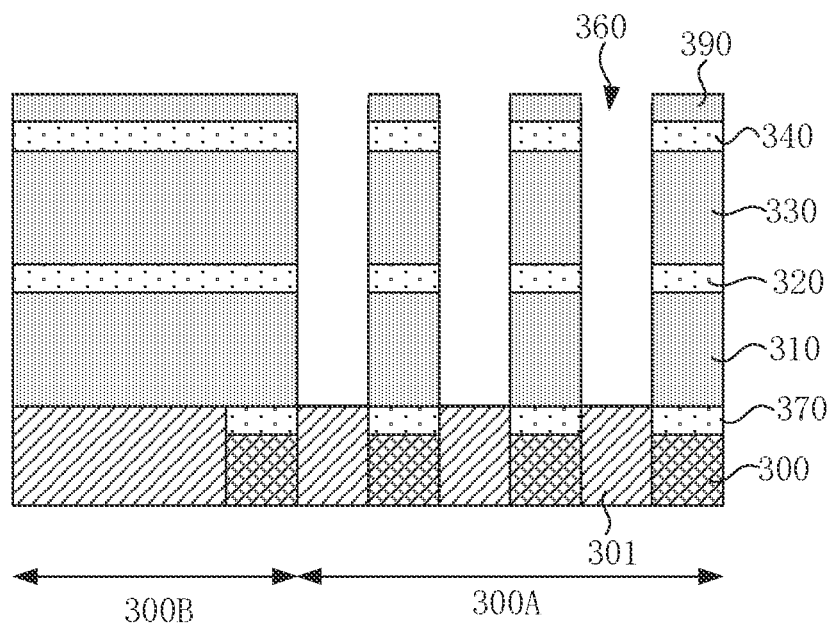
FIG. 3F is a cross-sectional schematic diagram of removing the photoresist layer provided by the second embodiment of the present invention.

In Step S25, referring to FIG. 3F, the photoresist layer 380 is removed.

The third sacrificial layer 390 further covers the top of the photoresist layer 380. Therefore, in this step, the third sacrificial layer 390 is first thinned to expose the photoresist layer 380, and then the photoresist layer 380 is removed. The photoresist layer 380 may be removed by means of an ashing process.

Figure 3G:
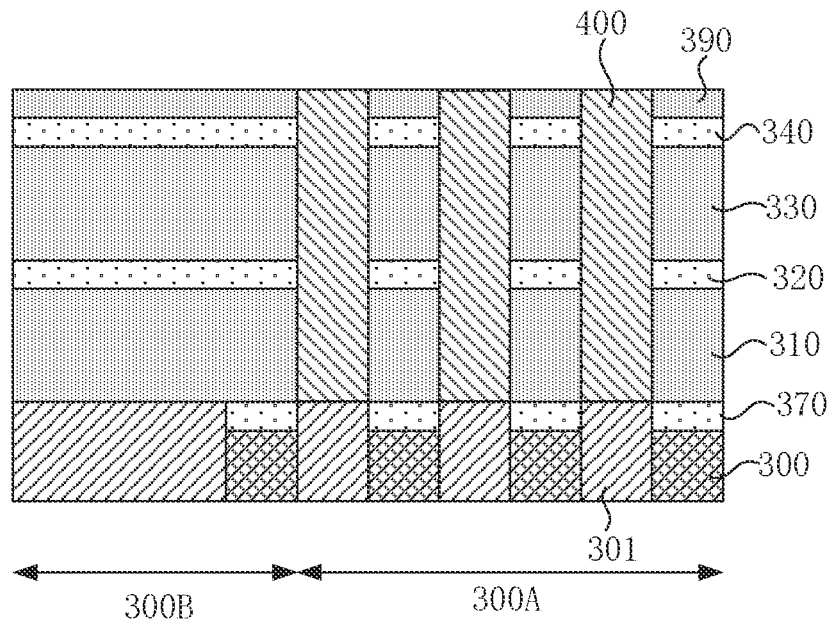
FIG. 3G is a cross-sectional schematic diagram of forming a lower electrode provided by the second embodiment of the present invention.

In Step S26, referring to FIG. 3G, the capacitor hole 360 is filled with a conductive material to form a lower electrode 400, where the lower electrode 400 is electrically connected to the conductive pad 301.

The conductive material may be a titanium nitride material or other materials that may be used as the lower electrode of the columnar capacitor. In this step, the conductive material may be deposited by means of an atomic layer deposition process to form the lower electrode 400. In some embodiments, due to limitation of an actual process, the conductive material is not only filled in the capacitor hole 360, but also covers a surface of the third sacrificial layer 390 in the array region 300A and the surface of the third sacrificial layer 390 in the peripheral region 300B. In this step, following steps are also included: forming a lower electrode material layer, where the lower electrode material layer not only is filled in the capacitor holes 360, but also covers the third sacrificial layer 390; and thinning the lower electrode material layer until the third sacrificial layer 390 is exposed, and rest of the lower electrode material layer serves as the lower electrode 400. A method of thinning the lower electrode material layer may be etch-back, the third sacrificial layer 390 is exposed, and only the conductive material in the capacitor hole 360 is retained, to form the lower electrode 400.

Figure 3H:
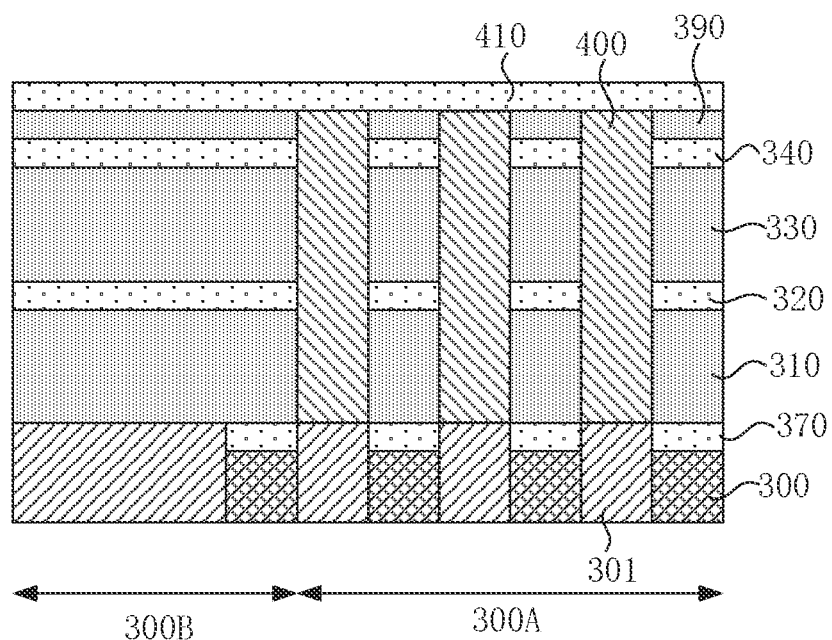
FIG. 3H is a cross-sectional schematic diagram of forming an auxiliary layer provided by the second embodiment of the present invention.

In Step S27, referring to FIG. 3H, an auxiliary layer 410 is formed, where the auxiliary layer 410 covers the third sacrificial layer 390 and the lower electrode 400.

In this step, an auxiliary layer 410 is deposited on the surface of the third sacrificial layer 390 and at a top of the lower electrode 400. The auxiliary layer 410 may be a nitride layer, for example, a silicon nitride layer. The auxiliary layer 410 and the third sacrificial layer 390 serve as dual protection layers for the top support layer 340, to prevent the top support layer 340 from being thinned in a subsequent process. In addition, the auxiliary layer 410 may further protect the lower electrode 400 from being damaged in a subsequent process.

Figure 3I:
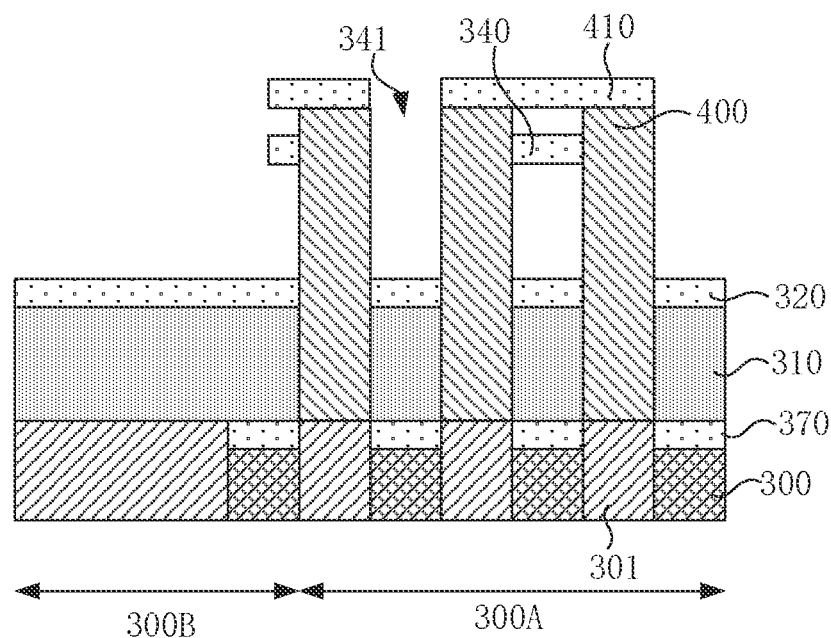
FIG. 3I is a cross-sectional schematic diagram of removing the third sacrificial layer and the second sacrificial layer provided by the second embodiment of the present invention.

In Step S28, referring to FIG. 3I, the auxiliary layer 410, the third sacrificial layer 390 and the top support layer 340 are patterned, and the third sacrificial layer 390 and the second sacrificial layer 330 are removed.

In some embodiments, in this step, the auxiliary layer 410, the third sacrificial layer 390 and the top support layer 340 are patterned to form a first opening 341. Next, the third sacrificial layer 390 and the second sacrificial layer 330 are removed along the first opening 341, to expose the intermediate support layer 320. A process for patterning the auxiliary layer 410, the third sacrificial layer 390 and the top support layer 340 may be photolithography and a dry etching process, and a method of removing the third sacrificial layer 390 and the second sacrificial layer 330 may be a wet etching process.

Figure 3J:
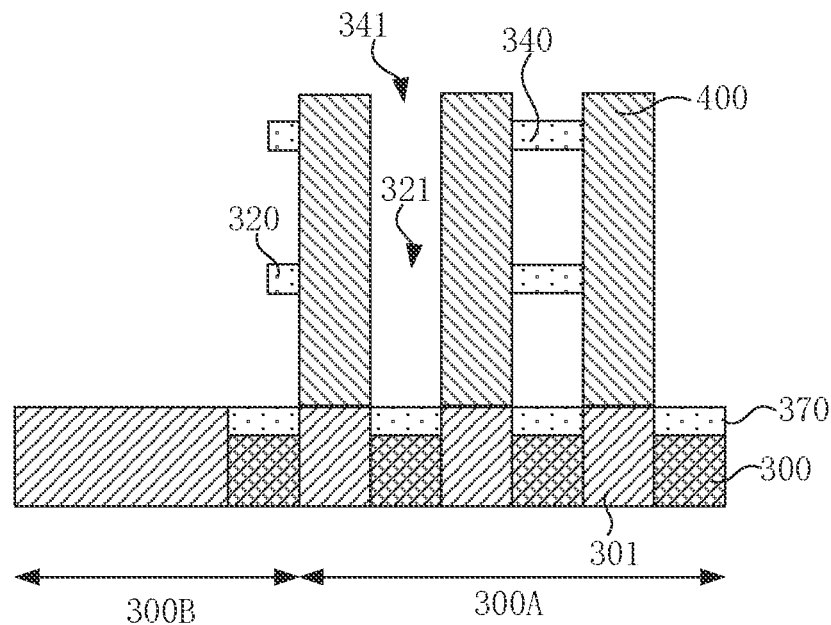
FIG. 3J is a cross-sectional schematic diagram of the removing the first sacrificial layer and the auxiliary layer provided by the second embodiment of the present invention.

In Step S29, referring to FIG. 3J, the intermediate support layer 320 is patterned, and the first sacrificial layer 310 and the auxiliary layer 410 are removed.

In some embodiments, in this step, the intermediate support layer 320 is patterned to form a second opening 321. A position of the second opening 321 corresponds to that of the first opening 341. A first sacrificial layer 310 is removed along the second opening 321 to expose a substrate 300. Processes of patterning the intermediate support layer 320 may be a photolithography process and a dry etching process, and a method for removing the first sacrificial layer 310 may be a wet etching process.

In this step, a material of the intermediate support layer 320 is the same as a material of the auxiliary layer 410. In this case, in the step of patterning the intermediate support layer 320, the auxiliary layer 410 may be synchronously removed, to expose the top of the lower electrode 400.

In this embodiment, after the first sacrificial layer 310 is removed, the bottom support layer 370 is exposed.

Figure 3K:
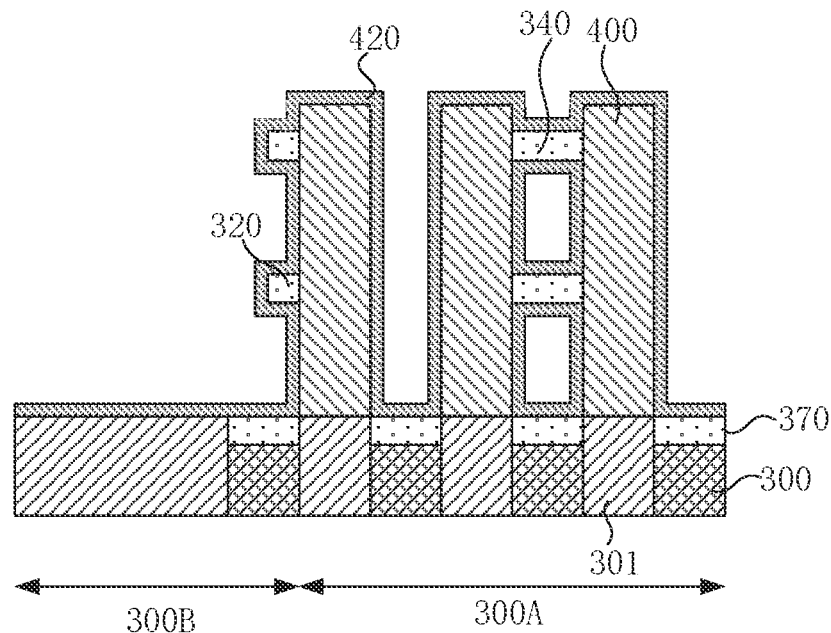
FIG. 3K is a cross-sectional schematic diagram of forming medium layer provided by the second embodiment of the present invention.

In Step S30, referring to FIG. 3K, a dielectric layer 420 is formed, where the dielectric layer 420 covers exposed surfaces of the substrate 300, the lower electrode 400, the intermediate support layer 320, and the top support layer 340.

The dielectric layer 420 may be a high-K dielectric layer to improve the performance of the columnar capacitor. For example, the high-K dielectric layer may be $Al_2O_3$, $HfO_2$, $Ta_2O_5$ and $ZrO_2$, which may be formed by means of chemical vapor deposition (CVD), atomic layer deposition (ALD), or metal organic chemical vapor deposition (MOCVD), etc.

Figure 3L:
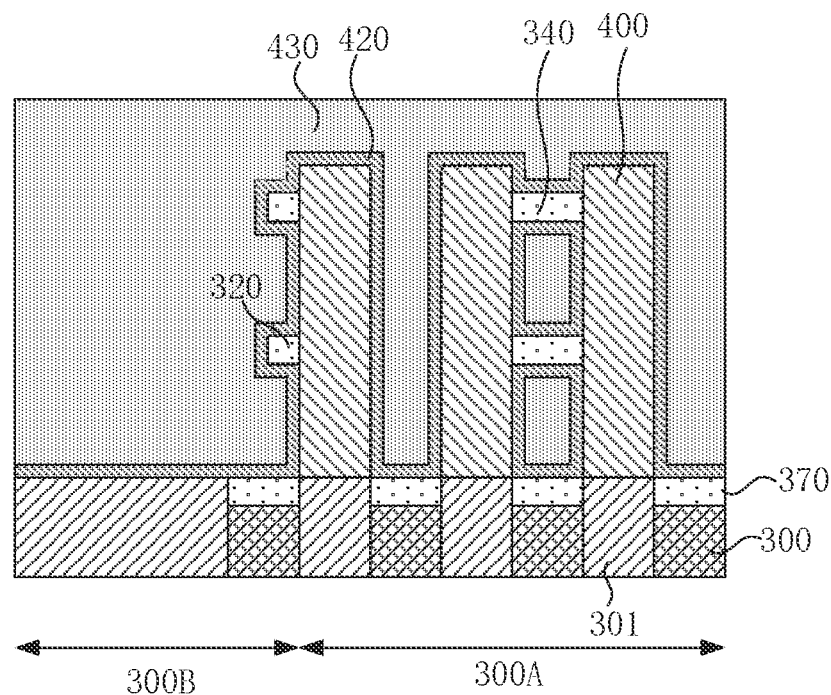
FIG. 3L is a cross-sectional schematic diagram of forming an upper electrode provided by the second embodiment of the present invention.

In Step S31, referring to FIG. 3L, an upper electrode 430 is formed, where the upper electrode 430 covers a surface of the dielectric layer 420.

In this embodiment, the upper electrode 430 is filled in an interspace among the bottom support layer 370, the intermediate support layer 320 and the top support layer 340, and covers the top support layer 340. The upper electrode 430, the dielectric layer 420 and the lower electrode 400 constitute the columnar capacitor. A plurality of columnar capacitors are arranged in an array to constitute an array structure of the columnar capacitor.

In the method for fabricating the array structure of the columnar capacitor in the present disclosure, before the mask layer is removed, the photoresist layer 380 is filled to adjust the thickness of the mask layer 350 in the peripheral region 300B and the thickness of the mask layer 350 in the array region 300A to be equal, thereby preventing from causing adverse impacts on the thickness of the top support layer 340 due to different thicknesses of the mask layers 350. In addition, in the method, the third sacrificial layer 390 and the auxiliary layer 410 are further formed to perform dual protection on the top support layer 340, thereby preventing the top support layer 340 from being thinned in subsequent processes, to increase the support strength of the top support layer 340, thereby further preventing the columnar capacitor from tilting due to insufficient support strength of the top support layer 340.

The present disclosure also provides a semiconductor structure. Referring to FIG. 3H, the semiconductor structure includes a substrate 300, a plurality of conductive pads 301 are disposed in the substrate 300, and the substrate 300 is divided into the array region 300A and the peripheral region 300B.

The substrate 300 may include a silicon substrate, a germanium (Ge) substrate, a silicon germanium (SiGe) substrate, a silicon-on-insulator (SOI) substrate or a germanium-on-insulator (GOI) substrate, etc. The substrate 300 may also be a substrate including other elemental semiconductors or compound semiconductors, such as gallium arsenide, indium phosphide, or silicon carbide, etc., and the substrate 300 may also be a stacked structure, such as a silicon/germanium silicon stack, etc. In addition, the substrate 300 may be an ion-doped substrate, which may be P-type doped or N-type doped. In the substrate 300, a plurality of peripheral devices may also be formed, such as field effect transistors, capacitors, inductors and/or P-N junction diodes, etc. In this embodiment, the substrate 300 is the silicon substrate, which further includes other device structures, such as a bit line structure, a transistor structure, etc., which are not shown because they are not related to the present disclosure.

The first sacrificial layer 310, the intermediate support layer 320, the second sacrificial layer 330, the top support layer 340 and the third sacrificial layer 390 are stacked on the substrate 300. The surface of the top support layer 340 positioned in the array region 300A is flush with the surface of the top support layer 340 positioned in the peripheral region 300B.

In this embodiment, materials of the first sacrificial layer 310, the second sacrificial layer 330 and the third sacrificial layer 390 may be oxides, such as silicon oxide. Materials of the intermediate support layer 320 and the top support layer 340 may be nitrides, such as silicon nitride.

In this embodiment, a bottom support layer 370 is further provided on the substrate 300. The bottom support layer 370 covers the substrate 300 and exposes the conductive pads 301, and the first sacrificial layer 310 covers the bottom support layer 370. A material of the bottom support layer 370 may be nitrides such as silicon nitride.

The lower electrode 400 is arranged in the array region 300A, where the lower electrode 390 penetrates through the third sacrificial layer 390, the top support layer 340, the second sacrificial layer 330, the intermediate support layer 320 and the first sacrificial layer 310, and the lower electrode 390 is electrically connected to the conductive pad 301. The lower electrode 400 may be a titanium nitride electrode. A top of the lower electrode 390 may be flush with the surface of the third sacrificial layer 390.

The auxiliary layer 410 covers the third sacrificial layer 390 and the lower electrode 400. The auxiliary layer 410 may be a nitride layer, for example, a silicon nitride layer. The auxiliary layer 410 and the third sacrificial layer 390 serve as dual protection layers for the top support layer 340, to prevent the top support layer 340 from being thinned in a subsequent process. In addition, the auxiliary layer 410 may further protect the lower electrode 400 from being damaged in a subsequent process.

In the semiconductor structure of the present disclosure, the surface of the top support layer 340 in the array region 300A is flush with the surface of the top support layer 340 in the peripheral region 300B. The auxiliary layer 410 and the third sacrificial layer 390 serve as the dual protection layers for the top support layer 340, to prevent the top support layer 340 from being thinned in the subsequent process. In this way, the thickness and the support strength of the top support layer 340 are ensured, thereby preventing the columnar capacitor formed on the basis of the semiconductor structure from tilting, and thus improving the performance of a memory formed subsequently.

What is mentioned above merely refers to some embodiments of the present disclosure. It shall be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A method for fabricating an array structure of a columnar capacitor, comprising:
providing a substrate provided with a plurality of conductive pads therein, wherein a first sacrificial layer, an intermediate support layer, a second sacrificial layer, a top support layer and a mask layer are stacked on the substrate, the substrate being divided into an array region and a peripheral region, a thickness of the mask layer positioned in the array region being less than a thickness of the mask layer positioned in the peripheral region, and a plurality of capacitor holes in the array region penetrating through the mask layer, the top support layer, the second sacrificial layer, the intermediate support layer and the first sacrificial layer, to expose the plurality of conductive pads;
forming a photoresist layer, wherein the photoresist layer is filled in the plurality of capacitor holes and covers the mask layer in the array region;
removing a part of the mask layer in the peripheral region, wherein an upper surface of a remaining part of the mask layer in the peripheral region is flush with an upper surface of the mask layer in the array region;
removing the photoresist layer on a surface of the mask layer and etching the mask layer by using the top support layer as an etching stop layer;
forming a third sacrificial layer, wherein the third sacrificial layer covers the top support layer;
removing the photoresist layer;
filling a conductive material in the plurality of capacitor holes to form a lower electrode, wherein the lower electrode is electrically connected to the plurality of conductive pads;
forming an auxiliary layer, wherein the auxiliary layer covers the third sacrificial layer and the lower electrode;
patterning the auxiliary layer, the third sacrificial layer and the top support layer, and removing the third sacrificial layer and the second sacrificial layer;
patterning the intermediate support layer and removing the first sacrificial layer and the auxiliary layer;
forming a dielectric layer, wherein the dielectric layer covers an exposed surface of the substrate, an exposed surface of the lower electrode, an exposed surface of the intermediate support layer, and an exposed surface of the top support layer; and
forming an upper electrode, wherein the upper electrode covers a surface of the dielectric layer.

2. The method for fabricating the array structure of the columnar capacitor according to claim 1, wherein the forming the photoresist layer further comprises:
forming a photoresist material layer, wherein the photoresist material layer is filled in the plurality of capacitor holes and covers the mask layer in the array region and the mask layer in the peripheral region; and
etching back the photoresist material layer until the mask layer in the peripheral region is exposed, to form the photoresist layer.

3. The method for fabricating the array structure of the columnar capacitor according to claim 2, wherein further, an upper surface of the photoresist layer is flush with an upper surface of the mask layer in the peripheral region.

4. The method for fabricating the array structure of the columnar capacitor according to claim 1, wherein in the removing the photoresist layer on the surface of the mask layer and etching the mask layer by using the top support layer as the etching stop layer, an etching rate of an etching substance to the mask layer is greater than an etching rate to the top support layer.

5. The method for fabricating the array structure of the columnar capacitor according to claim 4, wherein further, the mask layer is a polycrystalline silicon layer, and the top support layer is a silicon nitride layer.

6. The method for fabricating the array structure of the columnar capacitor according to claim 1, wherein in the forming the third sacrificial layer, the third sacrificial layer is formed by means of a spin-on deposition process.

7. The method for fabricating the array structure of the columnar capacitor according to claim 6, wherein the third sacrificial layer is an oxide layer.

8. The method for fabricating the array structure of the columnar capacitor according to claim 1, wherein the forming the third sacrificial layer further comprises:
forming a third sacrificial material layer, wherein the third sacrificial material layer covers the top support layer and the photoresist layer; and
thinning the third sacrificial material layer until the photoresist layer is exposed, to form the third sacrificial layer.

9. The method for fabricating the array structure of the columnar capacitor according to claim 1, wherein the filling the conductive material in the plurality of capacitor holes to form the lower electrode further comprises:
forming a lower electrode material layer, wherein the lower electrode material layer is filled in the plurality of capacitor holes, and covers the third sacrificial layer; and
thinning the lower electrode material layer until the third sacrificial layer is exposed, to form the lower electrode.

10. The method for fabricating the array structure of the columnar capacitor according to claim 1, wherein the patterning the auxiliary layer, the third sacrificial layer and the top support layer, and removing the third sacrificial layer and the second sacrificial layer further comprises:
patterning the auxiliary layer, the third sacrificial layer and the top support layer to form a first opening, wherein the first opening exposes the third sacrificial layer and the second sacrificial layer; and
removing the third sacrificial layer and the second sacrificial layer along the first opening to expose the intermediate support layer.

11. The method for fabricating the array structure of the columnar capacitor according to claim 10, wherein the patterning the intermediate support layer and removing the first sacrificial layer and the auxiliary layer further comprises: patterning the intermediate support layer to form a second opening;
removing the first sacrificial layer along the second opening to expose the substrate; and
removing the auxiliary layer.

12. The method for fabricating the array structure of the columnar capacitor according to claim 11, wherein a position of the first opening corresponds to a position of the second opening.

13. The method for fabricating the array structure of the columnar capacitor according to claim 1, further comprising a bottom support layer, wherein the bottom support layer covers the substrate, the conductive pad is exposed, and after the patterning the intermediate support layer and removing the first sacrificial layer, the bottom support layer is exposed.

* * * * *